United States Patent [19]
Ohmoto et al.

[11] Patent Number: 5,679,151
[45] Date of Patent: Oct. 21, 1997

[54] METHOD FOR GROWING SINGLE CRYSTAL

[75] Inventors: Seiichiro Ohmoto, Kobe; Katsuhiro Uehara, Takasago; Hiroshi Okada, Kobe; Yoshihiko Sakashita, Takasago; Takao Kawanaka, Kobe, all of Japan

[73] Assignee: Kabushiki Kaisha Kobe Seiko Sho, Kobe, Japan

[21] Appl. No.: 604,663

[22] Filed: Feb. 21, 1996

[30] Foreign Application Priority Data

| Mar. 16, 1995 | [JP] | Japan | 7-057749 |
| Aug. 25, 1995 | [JP] | Japan | 7-217487 |

[51] Int. Cl.$^6$ ............................................ C30B 11/12
[52] U.S. Cl. ............................ 117/83; 117/81; 117/204; 117/206
[58] Field of Search ...................... 117/2, 81, 83, 117/204, 206, 937

[56] References Cited

U.S. PATENT DOCUMENTS

| 2,402,582 | 6/1946 | Scaff | 117/81 |
| 5,037,621 | 8/1991 | Kennedy et al. | 117/83 |
| 5,499,600 | 3/1996 | Okuno et al. | 117/81 |

FOREIGN PATENT DOCUMENTS

| 63-310786 | 12/1988 | Japan . | |
| 1126289A | 5/1989 | Japan | 117/81 |
| 1-264990 | 10/1989 | Japan . | |
| 0255689A | 12/1989 | Japan | 117/81 |
| 5-70288 | 3/1993 | Japan . | |
| 5097566A | 4/1993 | Japan | 117/83 |
| 5-35720 | 5/1993 | Japan . | |

OTHER PUBLICATIONS

Akira Omino, et al., "Bridgman Growth of ZnSe Crystals with a PBN Crucible Sealed in a Molybdenum Capsule", Journal of Crystal Growth, vol. 117, (pp. 80–84), 1992.

Michael Shone, et al., "Vertical Zone Growth and Characterization of Undoped and Na, P and Mn Doped ZnSe", Journal of Crystal Growth, vol. 86, (pp. 132–137), 1988.

Primary Examiner—Felisa Garrett
Attorney, Agent, or Firm—Oblon, Spivak, McClelland, Maier & Neustadt, P.C.

[57] ABSTRACT

Method of forming a single crystal of ZnSe. A charge of material is loaded in a container. The charge of material is melted to create a melt of material. A single crystal is grown from the melt of material. Then, the grown crystal is brought out of contact with the wall surface of the container. The temperature of the crystal is varied across its phase transition temperature range while establishing a temperature gradient from one end of the grown crystal to the other end. This method is carried out, using a crystal grower comprising the container and an elevation member. The container is disposed inside a high-pressure vessel. The container tapers off downward and is provided with a hole extending from its lower end. The elevation member is inserted into the hole from below to push the grown crystal in a crucible upward. The container is composed of plural separable parts. After the growth of the crystal, the assembled parts are moved substantially horizontally outwardly so that the parts are separated from each other.

16 Claims, 13 Drawing Sheets

METHOD FOR GROWING SINGLE CRYSTAL

BACKGROUND OF THE INVENTION

1. Field of the Invention

The present invention relates to a method and machine for growing a single crystal and, more particularly, to a method and apparatus for growing a single crystal of ZnSe or another material which makes a phase transition when a single crystal grown from a melt is cooled.

2. Description of the Related Art

A blue semiconductor laser emits light of a wavelength which is about half the wavelength emitted by an existing red semiconductor laser and capable of increasing the optical storage density of a storage medium fourfold, the storage medium being typified by an optical compact disk. Furthermore, the blue semiconductor laser is more compact and consumes less electric power than other light sources. If a diode producing blue light is realized, then the three optical primary colors can be obtained when existing diodes producing red light and green light, respectively, are used in conjunction. Therefore, it is considered that these diodes are applied to a large-sized, high-brightness color display. Under these situations, development of such a blue light-emitting diode has been eagerly sought.

A wide-bandgap semiconductor material having a bandgap corresponding to the energy of blue light is used for manufacture of a blue light-emitting diode. Among wide-bandgap semiconductor materials, ZnSe-based II-VI compound semiconductors are regarded as most promising.

However, a fabrication method of industrially fabricating ZnSe single-crystal substrates of high quality at low cost has not yet been established. Generally, a substrate for epitaxial growth is made from a GaAs crystal having a lattice constant close to that of a ZnSe crystal.

Although the lattice constant of 5.654 Å of a GaAs substrate is close to the lattice constant of 5.668 Å of a ZnSe substrate, a mismatch of 0.25% exists between them. Furthermore, these two materials differ in coefficient of thermal expansion. Therefore, strain is left in the epitaxial layer. This induces defects such as dislocations, which in turn inevitably deteriorates the device characteristics. For these reasons, there is a demand for a method of fabricating high-quality ZnSe substrates in order to put blue light-emitting devices into practical use.

ZnSe has a melting point of 1526° C. ZnSe assumes a stable hexagonal system at high temperatures and takes a stable cubic system at low temperatures. A phase transition occurs between them at 1420° C. Therefore, if a single crystal of ZnSe is grown from a melt by a conventional method such as the Czochralski process (i.e., the seed crystal is pulled upward while rotated) or the Bridgman method, then the phase makes a transition at around 1420° C. from the high-temperature phase (the hexagonal system) to the low-temperature phase (the cubic system). This phase transition causes twin defects. This makes it impossible to obtain a single crystal of a low defect density (see Michael S. et al., Journal of Crystal Growth, Vol. 86, 1988, pp. 132-137).

Japanese Patent Laid-Open No. 310786/1988 discloses a method of growing a single crystal of ZnSe by the Bridgman method but no description of twin crystals is made. The contents of the technique described in this Japanese Patent Laid-Open No. 310786/1988 are described in detail in Journal of Crystal Growth, 117 (1992), pp. 80-84. This paper says that twin crystals are produced.

Methods for circumventing twin defects caused by a phase transition as described above have been proposed. In these proposed methods, crystals are grown at a temperature lower than the phase transition temperature, i.e., 1420° C., by a low-temperature growth method such as chemical vapor deposition (Japanese Patent Laid-Open No. 264990/1989) or physical vapor deposition. Thus, crystals of a cubic system are grown. However, with these growth methods, the growth rates are low and the productivity is very low.

Japanese Patent Publication No. 35720/1993 discloses a method of growing a crystal at a temperature lower than the phase transition point of 1420° C. In this method, a melt consisting of 57.5-92.5 mol % of Se and remaining percent of Zn is slowly cooled in an inert gas ambient at a pressure of 100 to 2000 atm. However, where a crystal of ZnSe is grown, using the Se-rich melt deviating from the stoichiometric ratio (Zn/Se=1/1) in this way, the melt becomes further enriched with Se as the crystal grows. Concomitantly, the liquid phase temperature (the equilibrium temperature between ZnSe in solid phase and the melt) drops and so the temperature must be controlled in a quite complex manner in order to grow the crystal at a constant rate. In the method disclosed in the above-cited Japanese Patent Publication No. 35720/1993, as the melt becomes heavily enriched with Se, so-called compositional supercooling tends to occur. This greatly accelerates crystallization. As a result, the melt may become polycrystalline, or the melt may be introduced in the crystal and solidification takes place. As a consequence, the finished crystal contains macroscopic crystal defects in large quantities. To prevent this, the crystal must be grown at a quite low rate of several millimeters per day. Furthermore, even if crystals are grown even under these conditions, the obtained crystallinity is poor. Accordingly, this method is not adapted for applications where low defect density is required such as semiconductor crystals.

Although supply of the aforementioned inert gas is effective in slowing down variation of the composition of the melt, the supply is not directly involved in chemical equilibrium with ZnSe. Therefore, even if crystal growth is not done, the composition of the melt is invariably varied by evaporation of Se and Zn. Moreover, no means is available for precisely detecting variations of the composition of the melt. In practice, therefore, it is quite difficult to conduct crystal growth stably.

Eventually, a melt growth method is advantageous in terms of productivity as a method of industrially growing bulk crystal from which a substrate is fabricated. Therefore, methods which are based on the Bridgman method (i.e., a crystal is grown from a melt) and in which twin defects caused by a phase transition from the hexagonal system to the cubic system at around 1420° C. are actively being developed.

SUMMARY OF THE INVENTION

It is an object of the present invention to provide a method of growing a good-quality single crystal of ZnSe which produces reduced twin defect density when the crystal is grown from a melt and then cooled, resulting in a phase transition.

It is another object of the invention to provide a simple single-crystal formation machine which can implement the above-described method of growing a single crystal.

In one preferred embodiment of the present invention, a charge of material is contained in a container. The charge of material is melted, thus producing a melt of material. A single crystal is grown from the melt of material. Then, the grown crystal is not allowed to contact the wall surface of the container holding the charge of material. Subsequently, the temperature of the crystal is passed through its phase transition temperature range while a temperature gradient is established from one end of the grown crystal toward the other end. One example of material is ZnSe. To cause the temperature of the crystal to pass through its phase transition temperature range, the grown crystal may be lowered into the container or the electric power supplied to the heater incorporated in the container may be controlled. Furthermore, during the growth of the single crystal, a material which is liquid in the crystal phase transition temperature range and does not react with the crystal may be added. A preferred example of this nonreactive material is boron oxide. To prevent the crystal from touching the wall surface of the container as mentioned above, the container may be divided into plural parts.

In this novel method, the grown crystal does not contact the wall surface of the container containing the charge of material. The crystal is cooled down through the phase transition temperature range while establishing a temperature gradient from one end of the grown crystal to the other end. Then, the crystal is cooled. Therefore, nonuniform nucleation which would normally be caused at the contact point with the container is suppressed. Furthermore, the phase transition temperature range is extended in one direction. This results in a good-quality single crystal having reduced twin defect density.

Another preferred embodiment of the invention is a machine for growing a single crystal. This machine comprises a container containing a charge of material, the container being placed in a high-vacuum vessel. The container tapers off downward, i.e., the diameter of the container is increased upwardly. The container is provided with a hole extending from its lower end. An elevation member is inserted into the hole to push the grown crystal in a crucible upward.

In another feature of the invention, the container for holding the charge of material is composed of separable plural parts. After the growth of the crystal, the assembled parts are moved substantially horizontally outwardly so that they move away from each other. In this way, the parts are moved away from the outer peripheral surface of the grown crystal.

The novel machine for forming a single crystal can carry out the novel method of forming a single crystal.

DESCRIPTION OF THE PREFERRED EMBODIMENTS

In a method of forming a single crystal in accordance with the present invention, a charge of material is loaded in a raw material container. The charge of material is melted, thus producing a melt of material. A single crystal is grown from the melt. Then, the grown crystal is cooled down through its phase transition temperature range with a temperature gradient established from one end of the crystal toward the other end while the crystal is not in contact with the wall surface of the container. As an example, ZnSe is used as the raw material. In the case of ZnSe, the phase transition temperature range through which the crystal temperature passes is preferably 1409°±5° C.

Specifically, in the present invention, the outer periphery of the grown crystal is not constrained during the cooling process. The temperature gradient is established. Under this condition, the single crystal which makes a phase transition during the cooling after the growth from the melt passes through the phase transition temperature range. On the phase transition, contact with the wall surface of the raw material container such as a crucible is prevented. This reduces the twin defect density, for the following reason.

Figure 3:
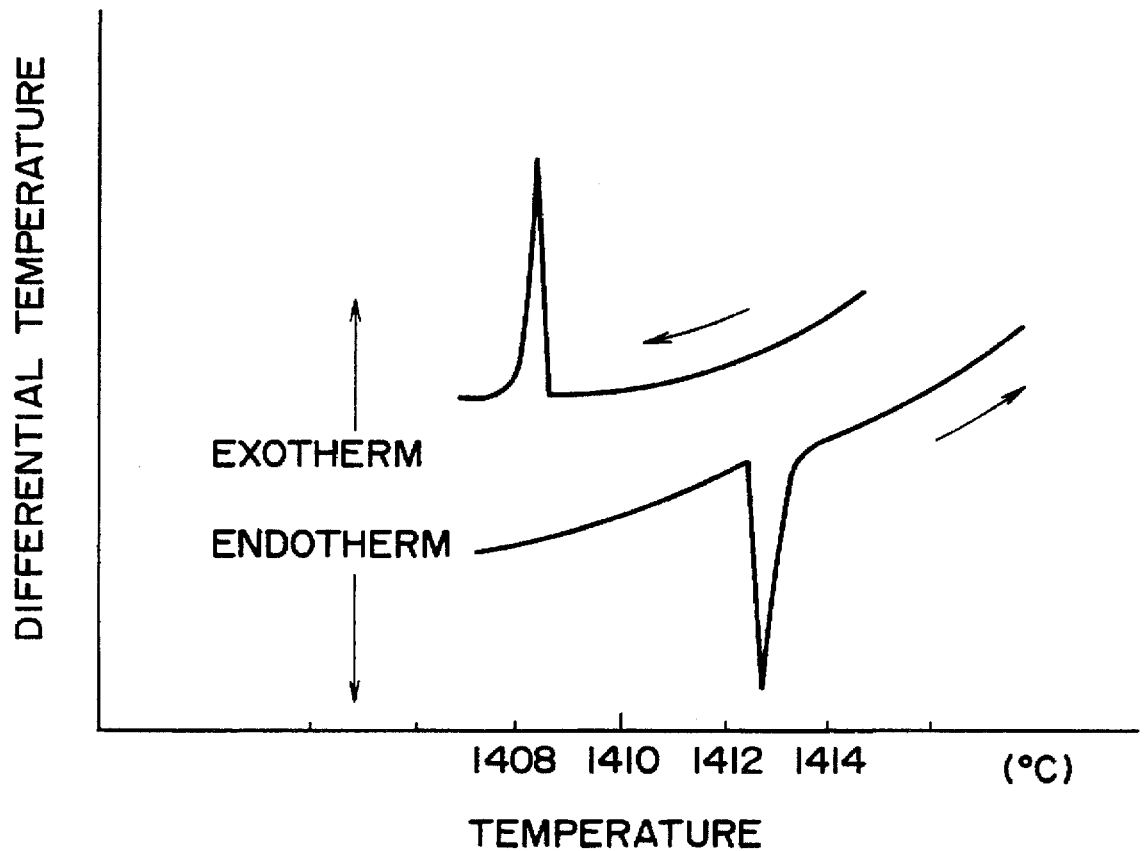
FIG. 3 is a graph showing results of differential thermal analysis produced when the temperature of ZnSe crystal is elevated and lowered.

Samples of ZnSe producing phase transitions during cooling subsequent to crystal growth were subjected to differential thermal analysis. The results are shown in FIG. 3. In the measurements, in order to prevent the compositions of the samples of ZnSe from being varied by thermal decomposition, the raw material of each sample was loaded into a container of molybdenum, and the container was closed off by welding. As shown in the graph, during temperature elevation, ZnSe makes a phase transition at 1412.5° C. from the cubic system (3C) to the hexagonal system (2H). During temperature drop, ZnSe makes a phase transition at 1408.5° C. from the hexagonal system to the cubic system. In this way, a temperature hysteresis occurs as temperature is elevated and lowered. Consequently, during cooling, the crystal is supercooled.

We consider that similar supercooling occurs when a phase transition is made during temperature drop subsequent to crystal growth. Accordingly, we think that the cubic system of ZnSe in the low-temperature phase nucleates nonuniformly at the contact point between the inner wall surface of the raw material container such as a crucible and the growing crystal, thus starting a phase transition. The aforementioned temperature hysteresis differs, depending on the size of the crystal and on the defect density inside the crystal. However, all phase transition temperatures are roughly equal to 1409°±5° C.

It is assumed that a Zn atom and a Se atom make a pair. The phase transition of ZnSe from the hexagonal system (2H) to the cubic system (3C) means that a stacking ABABAB ... at the (0001) plane of the hexagonal system (2H) changes into a stacking ABCABC ... at the (111) plane. The phase transition is equivalent to the situation in which a movement of Schottkey partial dislocation occurs in every layer within the (0001) plane of the hexagonal system (2H). However, if random nucleation occurs at every portion of the crystal, and if the transition range is extended in the [0001] direction of the hexagonal system (2H) as mentioned above, then it is crystallographically demonstrated that the boundary between adjacent transition ranges statisfically becomes the twin planes of the cubic system (3C) after the transition.

It is assumed that the crystal growth azimuth of the hexagonal system (2H) lies in the [0001] direction. If atom movement of $\frac{1}{6}$ [112] occurs within the (0001) plane in a direction parallel to the (0001) plane, then the contour of the crystal shifts from the [0001] direction by 19.5 degrees. However, in a crystal growth method where a crystal is solidified within a crucible such as the Bridgman method, the aforementioned deformation of crystal does not occur because the crystal is constrained by the crucible. In this case, it is easily imagined that a great shearing stress acts on the crystal. Therefore, a slip deformation is induced in the crystal. As such a slip deformation is produced within the (111) plane which is a slip plane for the cubic system (3C), defects such as dislocations and deformation twins are produced. Thus far, we have estimated the twinning mechanism accompanying the phase transition of ZnSe from the hexagonal system (2H) to the cubic system (3C).

In the present invention, the crystal which has been grown is prevented from touching the wall surface of the raw material container. This suppresses nonuniform nucleation at the wall surface of the container. The crystal is cooled down through the phase transition temperature range while a temperature gradient is established from one end of the grown crystal to the other end. As a consequence, a good-quality single crystal having a reduced twin defect density can be obtained.

Where a single crystal is grown by the vertical Bridgman method or vertical temperature gradient method, the crystal is grown within a container whose diameter increases upwardly. Then, the grown crystal is elevated within the container at a temperature higher than the phase transition temperature range. Thus, the grown crystal is separated from the wall surface of the container. Subsequently, the crystal is cooled down through the phase transition temperature range.

In another method according to the invention, a substance which is in liquid phase in the phase transition temperature range of the crystal and does not react with the crystal is added. A single crystal is grown within the container. The grown crystal is cooled down through the phase transition temperature range with the unreactive substance interposed between the wall surface of the container and the grown crystal.

Where the charge of material is ZnSe, the unreactive substance is preferably boron oxide.

In a further method according to the invention, a single crystal is grown from a melt charge within a raw material container which can be divided into plural parts. Then, the container is divided into the parts. In this way, the grown crystal is separated from the wall surface of the container. Thereafter, the crystal is cooled down through its phase transition temperature range. Moreover, a single crystal can be grown by the CZ method.

One preferred example of a single-crystal formation machine for carrying out the novel single-crystal formation method is now described. This machine is of the vertical type and causes a single crystal to be grown within a crucible. This crucible tapers off downward, i.e., the diameter is increased upwardly. The crucible is provided with a hole extending from its bottom surface. An elevation member is inserted into the hole from below to push the grown crystal inside the crucible upward.

In a further other preferred example of the invention, a vertically extending charge-accommodating space is formed in a container holding a charge of material. A melt of material is solidified at one end of the vertically extending space to grow a single crystal. The container is made up of a plurality of parts which surround the charge-accommodating space. After growth of the crystal, the assembled parts of the container are substantially horizontally displaced outwardly so that they move away from the outer periphery of the grown crystal.

In this case, the container holding the charge of material is preferably composed of two parts which are on opposite sides of the vertical axis, or the center line, of the charge-accommodating space of substantially circular cross section. This machine is composed of a fewer number of components than heretofore. Also, the structure is simpler. Furthermore, the components can be assembled with greater ease.

EXAMPLE 1

Figure 1:
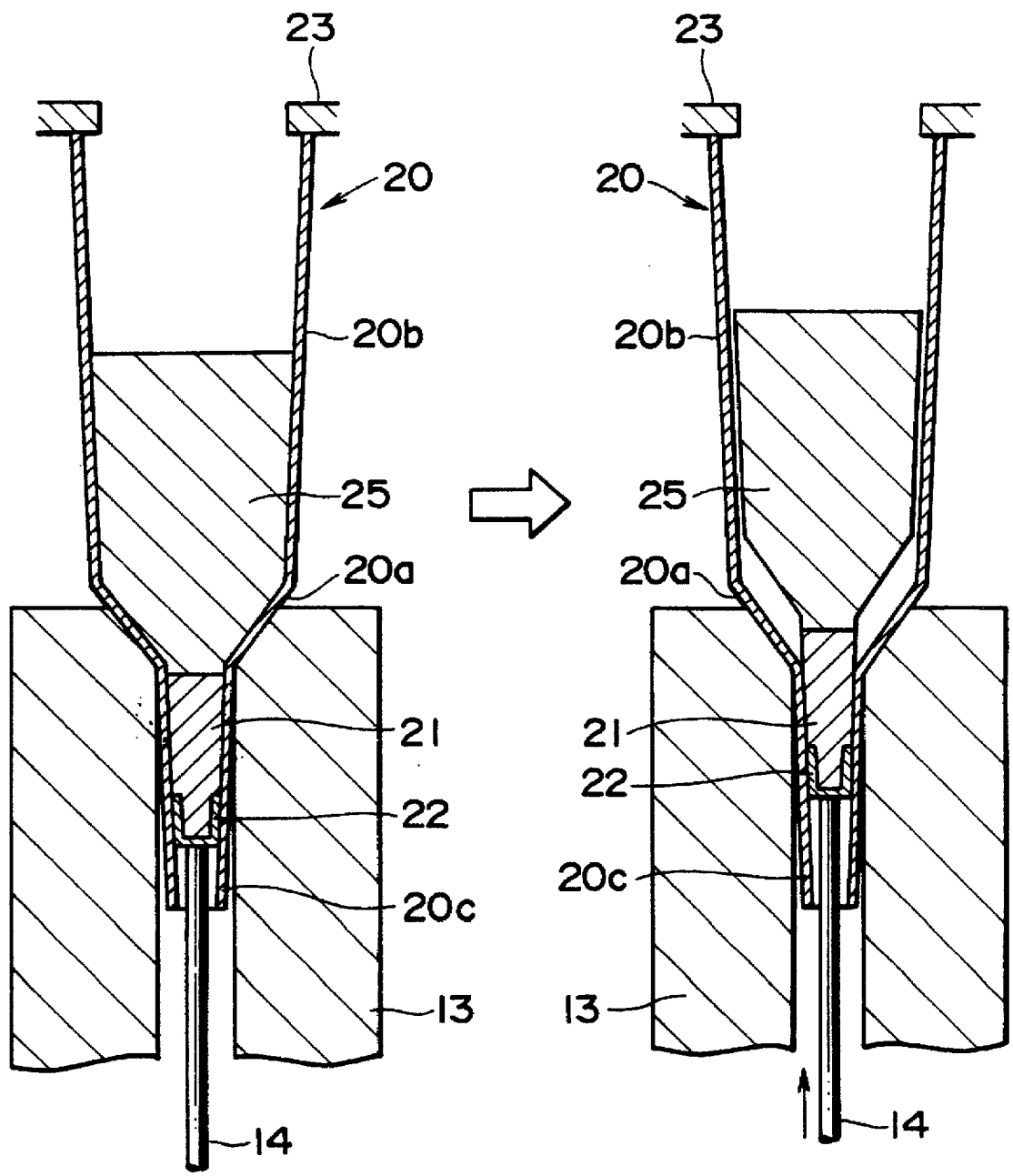
FIG. 1 is a cross-sectional view of a main portion of a machine for growing a single crystal by a method according to the invention.
Figure 2:
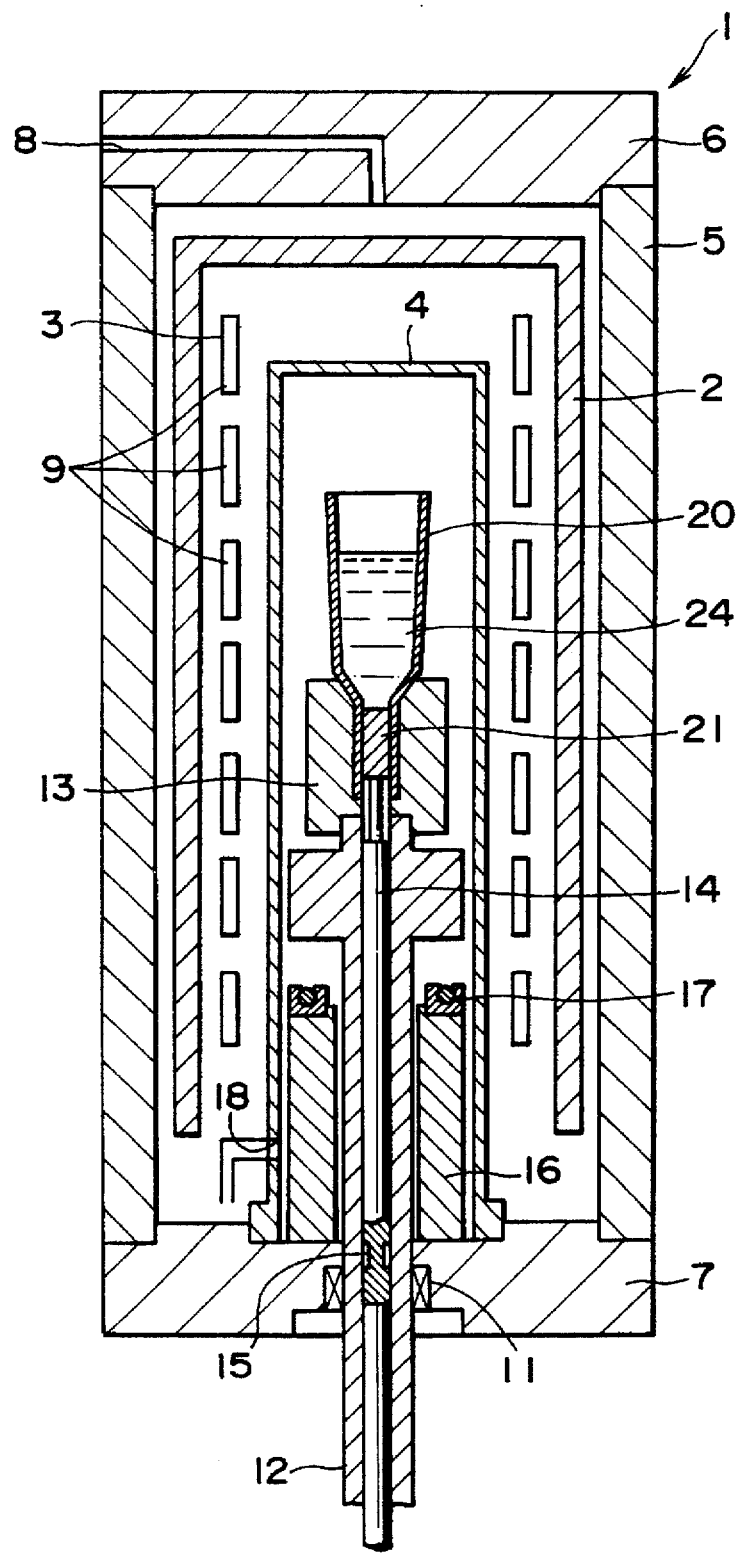
FIG. 2 is a schematic cross section of the machine which is shown in FIG. 1.

Example 1 of the present invention is next described by referring to FIGS. 1 and 2. FIG. 2 shows the structure of a single-crystal growth machine making use of the vertical Bridgman method. This machine comprises a high-pressure vessel 1, a top-closing, heat-insulating member 2 disposed in the high-pressure vessel 1, a heater arrangement 3 positioned within the heat-insulating member 2, and a chamber 4 disposed inside the heater arrangement 3.

The high-pressure vessel 1 comprises a cylindrical body 5 provided with openings at its top and bottom ends, together with a top cover 6 and a bottom cover 7 which are removably mounted in the openings, respectively. The top cover 6 is provided with a gas supply-and-discharge conduit 8 to permit an inert gas, such as argon gas, under pressure to be injected into the high-pressure vessel 1 and expelled from the vessel.

The heater arrangement 3 consists of a plurality of cylindrical heater elements 9 which are juxtaposed vertically. Temperature sensors (not shown) are mounted at various levels of the heater arrangement. The electric power supplied to the heater elements 9 is so controlled that the temperature detected by each temperature sensor (not shown) is maintained at a preset temperature.

The bottom cover 7 is centrally provided with a hole in which a crucible support shaft 12 is hermetically and rotatably mounted via a high-pressure sealing member 11, the shaft 12 extending upright. A crucible support base 13 which rotates and moves up and down together with the crucible support shaft 12 is placed on this support shaft 12. A crucible 20 (described later) is placed on the crucible support base 13.

An elevation shaft (elevation member) 14 is mounted in the crucible support shaft 12 via a seal ring 15 hermetically so as to be slidable vertically. The elevation shaft 14 extends through the crucible support shaft 12 into the crucible support base 13.

A reservoir support base 16 is mounted on the bottom cover 7 on the bottom side of the chamber 4. A reservoir 17 for generating Zn vapor is mounted on the reservoir support base 16. Zn is held in the reservoir 17 and heated to a desired temperature by the heater elements 9 at the lowest stage of the heater arrangement 3. As a result, Zn vapor is produced at a pressure equal to the equilibrium vapor pressure at the desired temperature.

A pressure-equalizing channel 18 is formed near the lower end of the chamber 4 to make the pressure inside the chamber equal to the outside pressure. This pressure-equalizing channel 18 may be a thin hole formed in the side wall and located near the lower end of the chamber 4, as shown. The pressure-equalizing channel 18 may also be a small gap between the bottom cover 7 and the chamber 4.

The aforementioned crucible 20 acting as the container for accommodating a charge of material is made of a high-purity heat-resisting material such as P—BN. As shown to the left of FIG. 1, the crucible 20 comprises an inverted truncated conical portion 20a fitted in the tapering hole in the crucible support base 13 and a material-accommodating portion 20b located over the conical portion 20a. The material-accommodating portion 20b tapers off, i.e., the diameter of the material-accommodating portion 20b increases upward. A thin tubular portion 20c in which a seed crystal 21 is inserted is formed under the conical portion 20a. This thin tubular portion 20c tapers off similarly to the conical portion 20a. The tubular portion 20c is provided with a hole extending from its lower end. The crucible 20 is placed on the crucible support base 13 such that the elevation shaft 14 is partially inserted in the overlying thin tubular portion 20c.

A seed crystal holder 22 made from P-BN is attached to the lower end of the seed crystal 21 inserted in the thin tubular portion 20c. This seed crystal holder 22 is made to slide on the inner surface of the thin tubular portion 20c so that the holder is brought into intimate contact with the inner surface, and the opening at the lower end of the tubular portion 20 is closed off.

A crucible fixture 23 is mounted above the crucible 20. As described later, an operation is performed to raise the elevation shaft 14 after completion of the growth of the single crystal within the crucible 20. At this time, the crucible fixture 23 hinders upward movement of the crucible 20. In this way, the seed crystal holder 22, the seed crystal 21, and the seed 25 grown on the seed crystal are moved upward within the crucible 20 and separated from the inner wall surface of the crucible 20.

One example of the process sequence for fabricating a single crystal of ZnSe with the machine described above is described, as well as results.

First, the seed crystal 21 to which the seed crystal holder 22 was attached was inserted into the thin tubular portion 20c of the crucible 20. Then, a charge of 6N-grade ZnSe polycrystals of 175 g was loaded into the crucible 20 and placed in position inside the machine as shown in FIG. 2. The diameter of the top portion of the material-accommodating portion 20b of the crucible 20 was 35 mm, and the diameter of the bottom portion was 25 mm. The length of the material-accommodating portion 20b was 100 mm. The thin tubular portion 20c had a diameter of about 2 mm and a length of 40 mm. The seed crystal 21 having a length of 30 mm was inserted into the thin tubular portion 20c.

Then, the charge of material inside the crucible 20 was heated to about 1530° C. by the heater elements 9 of the heater arrangement 3 in an inert gas ambient under high pressure such that the temperature gradient across the thin tubular portion 20c was 10° C./cm. At the same time, the temperature of the Zn reservoir 17 was elevated to 1000° C. In this manner, a melt of material 24 consisting of ZnSe was created in the crucible 20.

Argon gas was used as the inert gas. Dissociation of the melt of ZnSe was sufficiently prevented by generating Zn gas from the reservoir 17 up to a pressure in equilibrium with the melt of ZnSe. The pressure of the inert gas was not directly associated with prevention of dissociation of the ZnSe melt. Accordingly, the pressure of this inert gas was set slightly higher than the dissociation pressure of the high-dissociation pressure component at the heating temperature for the melt charge. By setting the pressure in this way, the vapor of the high-dissociation pressure component merely diffuses through the thin pressure-equalizing conduit 18. The aging of the composition of the melt of material was intrinsically suppressed by generating Zn vapor from the reservoir 17 up to the pressure equal to the equilibrium vapor pressure of the melt of material 24.

Then, the crucible support shaft 12 was lowered to move the whole crucible 20 downward at a rate of 2 mm/h. After completion of the crystallization of the charge of material, the elevation shaft 14 was made to move 5 mm upward. Thus, the seed crystal 21 and the overlying grown crystal 25 which were in intimate contact with the inner surface of the crucible 20 were raised, so that the seed crystal 21 and the crystal 25 were separated from the inner surface of the crucible 20 as shown to the right of the figure. The seed crystal 21 and the crystal 25 were held on the elevation shaft 14.

Under this condition, the crucible support shaft 12 was again lowered so that the whole crucible 20 dropped at 5 mm/h. As a result, the temperature of the whole crucible 20 passed through the phase transition temperature range. Temperature differences of ZnSe samples were measured when their temperatures were ramped up and down, and the results are shown in FIG. 3. According to the results, the phase transition temperature range was set to 1409° C.±5° C. At this time, the temperature gradient was 10° C./cm.

The grown crystal 25 had three twin planes at portions corresponding to the conical portion 20a of the crucible 20. The remaining portion was a single crystal. The full width at half maximum of (400) diffraction was 24 arc sec, which means high quality. The resistivity was as low as 0.2 Ω-cm. In this way, the grown crystal was adapted for a substrate for epitaxy for a light-emitting device.

COMPARATIVE EXAMPLE 1

A crystal was grown by the process sequence which was similar to the process sequence of Example 1 except for the step for raising the elevation shaft 14 by the machine shown in FIG. 2 after the completion of the crystallization of the raw material. In the present example, therefore, the grown crystal which was kept in intimate contact with the inner surface of the crucible 20 was cooled down through the phase transition temperature range.

The crystal obtained by this comparative example is a single crystal of ZnSe containing dense twin lamellar over the whole length of the crystal. This cannot be used for a substrate for fabrication of a device.

EXAMPLE 2

In the present example, a single crystal was grown by a vertical temperature gradient method. The same machine as used in Example 1 was used. Example 1 includes a step for lowering the crucible 20 by moving the crucible support shaft 12 so as to lower the temperature. Instead of this step, the separate heater elements 9 of the heater arrangement 3 were controlled to elevate the temperature.

In particular, a charge of material similar to the charge of material used in Example 1 was melted. Then, the electric power supplied to the heater elements 9 was controlled to move the constant-melting point line at 1520° C. at a rate of 3 mm/h from the bottom of the crucible 20 toward the top. In this way, the crystal of ZnSe was grown.

After completion of the crystallization of the charge of material, the elevation shaft 14 was made to move 5 mm upward, in the same manner as in Example 1. The crystal 25 was kept off the crucible 20. Thereafter, the heater elements 9 were controlled so that the temperature of the crucible 20 passed through the phase transition temperature range at a rate of 5 mm/h from the bottom toward the top. At this time, the temperature gradient was 10° C./cm.

The grown crystal 25 had three twin planes at portions corresponding to the conical portion 20a of the crucible 20. The remaining portion was a single crystal. The full width at half maximum of (400) diffraction was 22 arc sec, which means high quality. The resistivity was as low as 0.2Ω·cm. In this way, the grown crystal was adapted for a substrate for epitaxy for a light-emitting device.

EXAMPLE 3

In the present example, a crystal was grown by the vertical Bridgman method in the same way as in Example 1 but during the temperature decrease subsequent to the crystal growth, a liquid was interposed between the inner wall surface of the crucible 20 and the crystal. The present example is next described by referring to FIG. 4. It is to be noted that like components are indicated by like reference numerals in various figures and that those components which have been already described will not be described in detail below.

Figure 4:
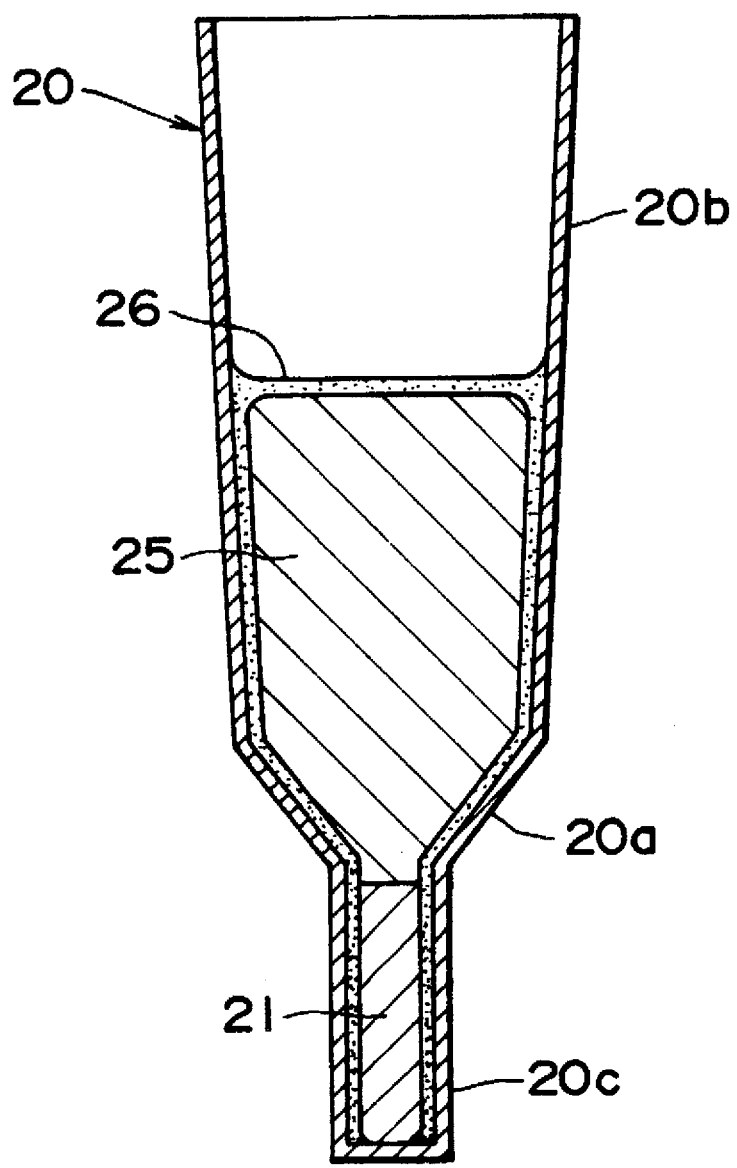
FIG. 4 is a schematic cross section of a main portion of another machine for growing a single crystal, and in which the crystal is being cooled down after grown.

Referring to FIG. 4, the crucible 20 has the thin tubular portion 20c whose lower end is closed off. The seed crystal 21 was loaded into the crucible 20 in the same manner as in Example 1. Then, a charge of boron oxide of 2 g was loaded into the crucible 20, together with 6N-grade raw material ZnSe of 175 g.

Subsequently, the crucible 20 was placed in position within the crystal grower used in Example 1. The temperature of the charge of material was increased to about 1530° C. while the temperature gradient across the thin tubular portion 20c was 10° C./cm. At the same time, the Zn reservoir 17 was ramped up to 1000° C., in the same manner as in Example 1. In this way, the charge of material was melted.

Then, the crucible 20 was lowered at a rate of 2 mm/h. When crystallization of the raw material was complete, the crucible 20 was further lowered at a rate of 5 mm/h. At this time, as shown in FIG. 4, boron oxide 26 in liquid phase existed between the grown crystal 25 and the crucible 20. The outer periphery of the crystal 25 was not in contact with the inner surface of the crucible 20. That is, no solid-solid contact was made. Under this condition, the temperature of the crucible 20 was passed through the phase transition temperature range with a temperature gradient of 10° C./cm.

The grown crystal 25 had three twin planes at portions corresponding to the conical portion 20a of the crucible 20. The remaining portion was a single crystal. The full width at half maximum of (400) diffraction was 31 arc sec, which means high quality. The resistivity was as low as 0.08Ω·cm. In this way, the grown crystal was adapted for a substrate for epitaxy for a light-emitting device.

EXAMPLE 4

Figure 5:
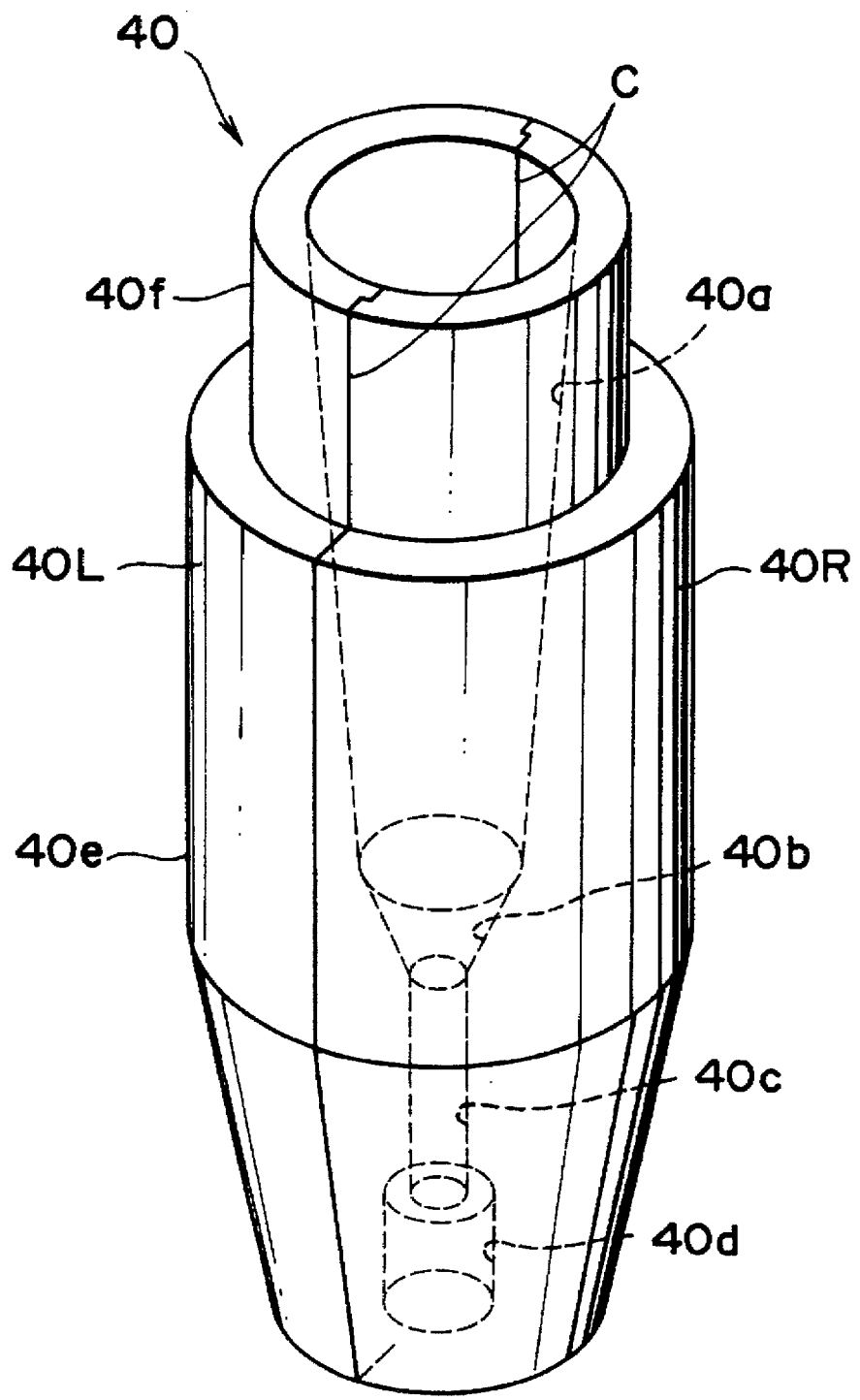
FIG. 5 is a perspective view of a split-type raw material container according to the invention.

In the above-described examples, the crucible 20 for accommodating a charge of material has a thickness which is substantially uniform vertically. In the present example, a raw material container 40 having a specially machined contour as shown in FIG. 5 is used. This container 40 is also made from a high-purity, heat-resisting material such as P-BN. A raw material-accommodating space forming a material-accommodating portion 40a, an inverted truncated conical portion 40b, and a thin tubular portion 40c is formed successively vertically from above inside the container 40. The material-accommodating portion 40a tapers off downwardly and extends to the upper end surface of the container 40. These components are similar in shape to their counterparts of the crucible 20 of Example 1. For example, the diameter of the top end of the material-accommodating portion 40a is 35 mm, and the diameter of the lower end is 25 mm. The length of the material-accommodating portion 40a is 100 mm. The thin tubular portion 40c has a diameter of about 2.5 mm and a length of 40 mm. A tightening hole 40d having a diameter larger than that of the tubular portion 40c is formed under the tubular portion 40c. The tightening hole 40d is internally threaded.

The outer surface of the raw material container 40 has a vertically intermediate portion which forms an enlarged portion 40e of circular cross section. A reduced portion 40f having a diameter smaller than that of the enlarged portion 40e is formed over the enlarged portion 40e, thus forming a step. The portion under the enlarged portion 40e tapers off downwardly.

The raw material container 40 is composed of parts 40L and 40R which are assembled together. These parts 40L and 40R are located on opposite sides of a partition plane C extending vertically substantially across the center position. Hence, the container 40 can be horizontally divided into two.

Figure 6:
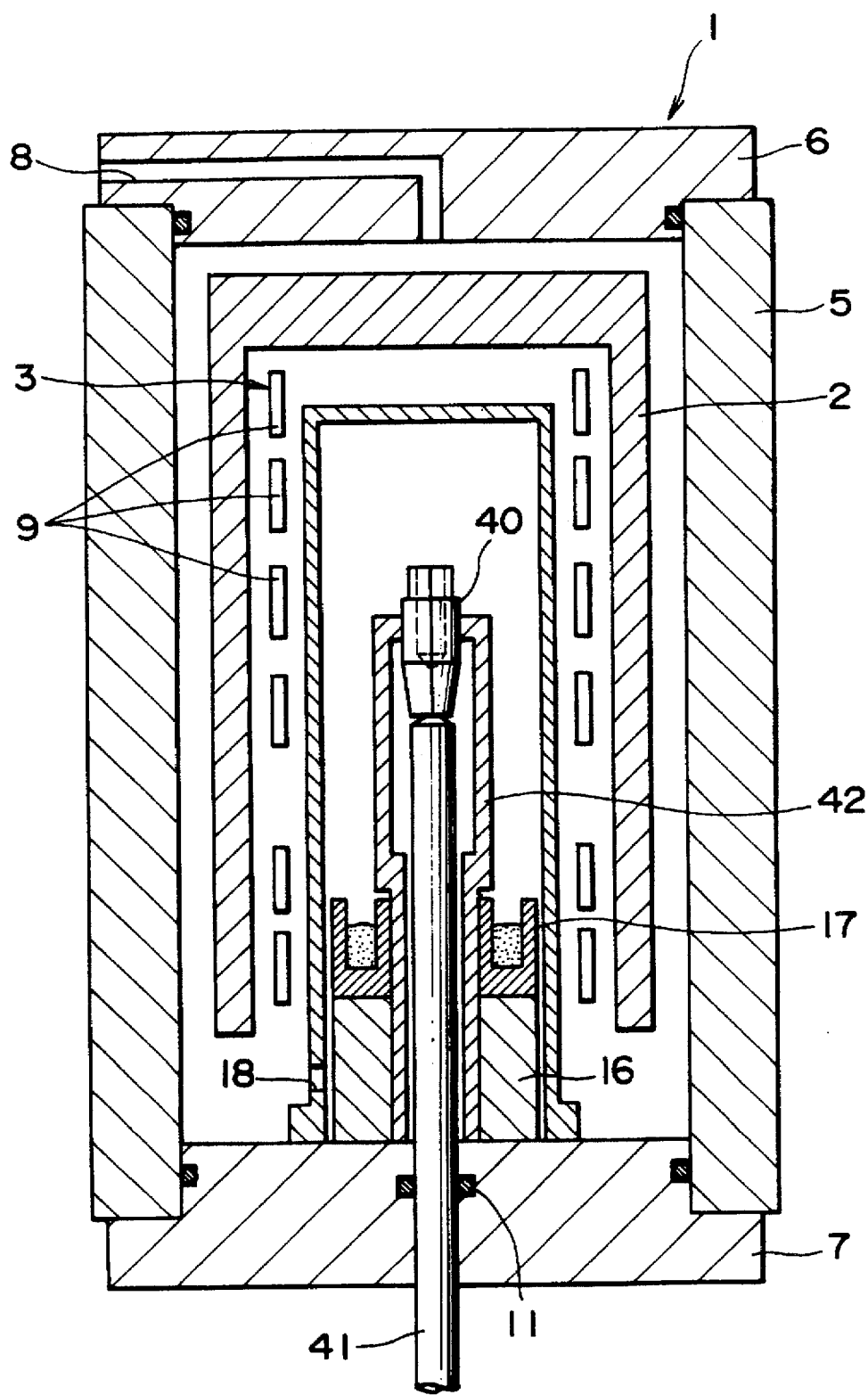
FIG. 6 is a schematic cross section of a single-crystal growth machine in which the split-type raw material container shown in FIG. 5 has been placed in position.

As shown in FIG. 6, the raw material container 40 shaped as described above is placed in position within a single crystal grower which is similar in structure to the crystal grower of Example 1 above. In this single crystal grower, however, a container support shaft 41 which extends through the bottom cover 7 and is driven vertically is mounted, instead of the crucible support shaft 12 (FIG. 2) in which the elevation shaft 14 is fitted. The container 40 is placed on this container support shaft 41. A container support member 42 which is tubular and extends upward is mounted over the bottom cover 7 so as to surround the container support shaft 41.

Figure 7:
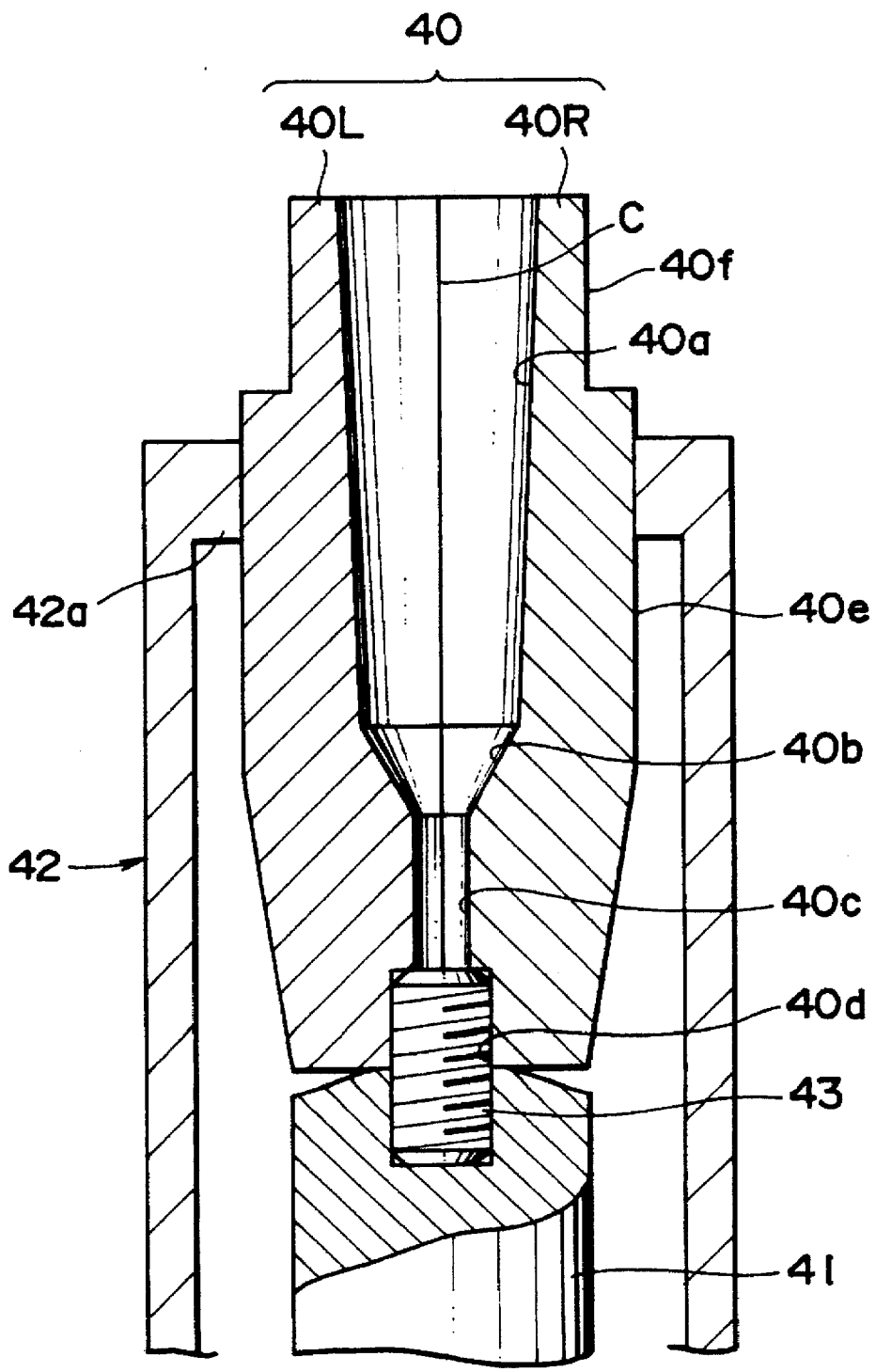
FIG. 7 is a cross-sectional view of the split-type raw material container shown in FIG. 5, and in which the container is mounted to a support shaft.

As shown in FIG. 7, a threaded fixture 43 is mounted to the upper end surface of the container support shaft 41. This fixture 43 is screwed into the tightening hole 40d in the container 40. Thus, even if the container support shaft 41 is lowered from the illustrated position, the raw material container 40 downwardly moves with the support shaft 41 without separating from this support shaft 41.

An inwardly protruding support portion 42a is mounted on the top end of the container support member 42 and has a given thickness. This support portion 42a is provided with a hole extending through it, the hole having a diameter substantially equal to that of the enlarged portion 40e. When the container 40 is assembled, the enlarged portion 40e is nested in this hole. This prevents the parts 40L and 40R of the container 40 from moving away from each other horizontally. That is, the container 40 is prevented from splitting in two. Hence, the container is kept assembled.

The top surface of the container support shaft 41 is inclined downwardly outwardly and has a central portion abutting against the bottom surface of the container 40 around the threaded fixture 43 so that the container 40 is held. The center of gravity of each of the parts 40L and 40R of the container 40 is located outside the abutting portion. Therefore, when the parts 40L and 40R are no longer constrained by the support portion 42a of the container support member 42, the parts 40L and 40R are thrown down apart from each other. That is, the parts are shifted horizontally outwardly while moving downwardly.

A single crystal of ZnSe was fabricated, using the raw material container 40 constructed as described above. The process sequence of this fabrication and examples of results are described below.

First, the bottom cover 7 of the crystal grower shown in FIG. 6 was lowered together with the container support shaft 41. The raw material container 40 was assembled as described above under the high-pressure vessel 1 and on the container support shaft 41. Then, a seed crystal was inserted into the thin tubular portion 40c. Subsequently, a charge of 6N-grade ZnSe polycrystals of 170 g was loaded, followed by upward movement of the bottom cover 7. The high-pressure vessel 1 was hermetically closed.

Then, in the same way as in Example 1, the charge of material inside the container 40 was heated to about 1530° C. by the heater arrangement 3 in an inert gas ambient under high pressure such that the temperature gradient across the thin tubular portion 40c was 10° C./cm. At the same time, the temperature of the Zn reservoir 17 was elevated to 1000° C. In this manner, a melt of material consisting of ZnSe was created in the container 40.

Subsequently, the container support shaft 41 was lowered to move the whole container 40 downwardly at a speed of 2 mm/h. Thus, a single crystal was grown from the melt of material. Meanwhile, the support portion 42a of the container support member 42 moved from the bottom of the enlarged portion 40e of the container 40 toward the top but the enlarged portion 40e was kept fitted in the support portion 42a. Consequently, the raw material container 40 was maintained in position.

Figure 8:
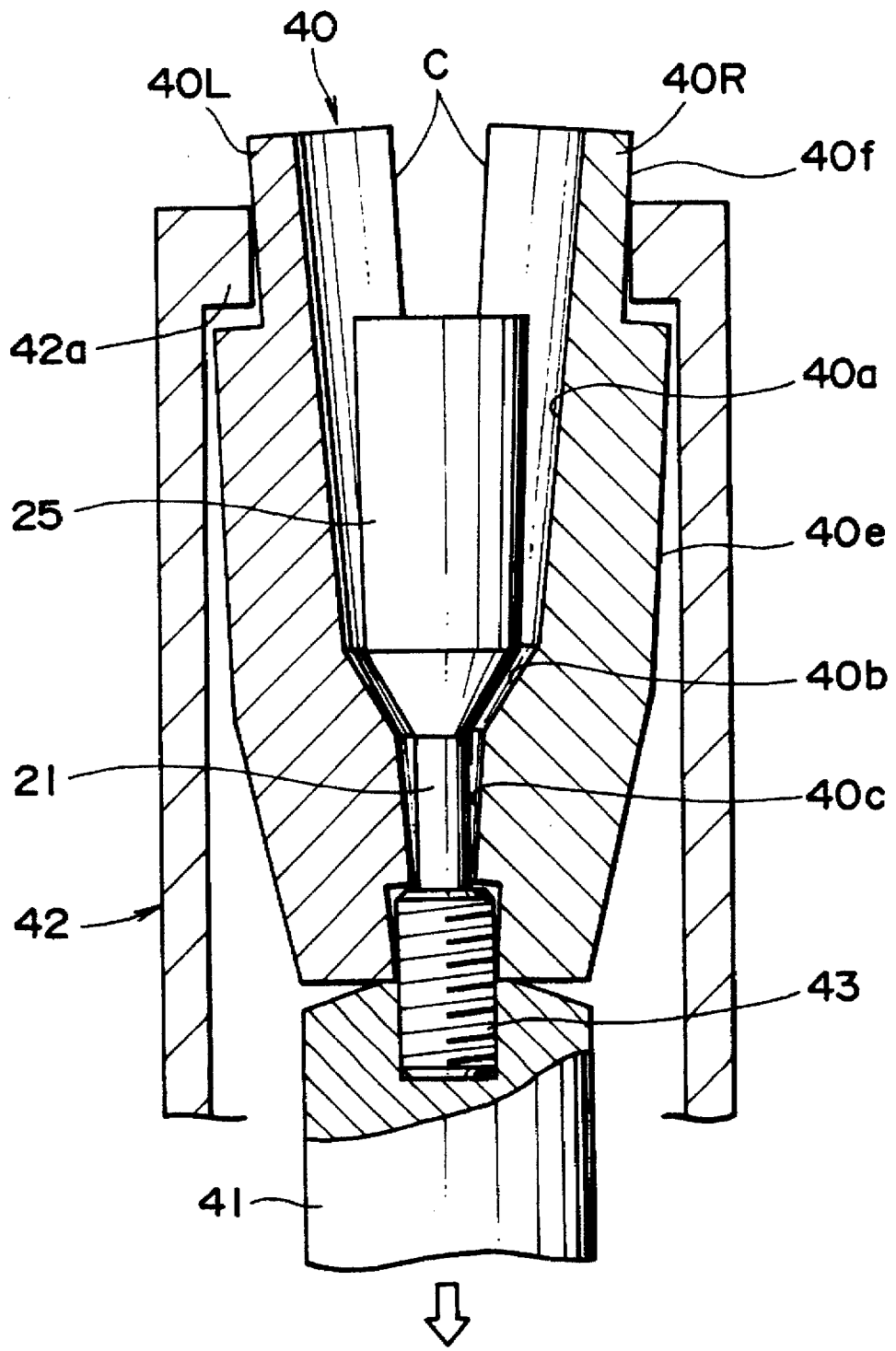
FIG. 8 is a cross-sectional view similar to FIG. 7, but in which the crystal is being cooled down after grown.

After crystallization from the melt of material was completed, downward movement of the container support shaft 41 was continued. As a result, the support portion 42a of the container support member 42 moved from the enlarged portion 40e of the container 40 to the reduced portion 40f, as shown in FIG. 8. During this movement, when the support portion 42a met the reduced portion 40f, the outer peripheries of the parts 40L and 40R of the container 40 were no longer held. Therefore, the parts 40L and 40R of the container 40 were thrown apart from each other until the outer periphery of the reduced portion 40f came into abutting engagement with the inner surface of the support portion 42a. As a consequence, the parts 40L and 40R were spaced from each other. That is, the container 40 was disassembled.

As a result, the grown crystal 25 was brought out of contact with the inner surface of the raw material container 40. The grown crystal 25 was held upright on the fixture 43, together with the seed crystal 21. Under this condition, the container support shaft 41 was further lowered at a speed of 5 mm/h. The aforementioned phase transition temperature range of 1409° C.±5° C. was passed. At this time, the temperature gradient was 10° C./cm.

The grown crystal had three twin planes at portions corresponding to the conical portion 40b. The remaining portion was a single crystal. The full width at half maximum of (400) diffraction was 24 sec, which means high quality. The resistivity was as low as 0.2Ω·cm. In this way, the grown crystal was adapted for a substrate for epitaxy for a light-emitting device.

As described thus far, the raw material container 40 which is built by assembling together the parts 40L and 40R is used. After the growth of the crystal, the parts 40L and 40R are separated from each other so that the grown crystal 25 is brought out of contact with the container 40. The crystal is cooled down through the phase transition temperature range. In this way, in the present example, a high-quality single crystal having a reduced twin defect density can be obtained.

Also in this example, the container support shaft 41 for moving the raw material container 40 up and down acts also to move the parts 40L and 40R away from each other substantially horizontally. Therefore, any dedicated drive mechanism or driving force source for shifting the parts 40L and 40R of the container 40 substantially horizontally so that they are separated from each other is not necessary. Hence, the whole structure is made simpler.

In the above example, the raw material container 40 is lowered within the furnace. The charge of melt is ramped down from its lower side to grow a single crystal. That is, a single crystal is grown by a method based on the vertical Bridgman method. It is also possible to grow a crystal by a process based on the vertical temperature gradient method in the same way as in Example 2. In particular, during crystal growth, the raw material container 40 is kept at rest and, at the same time, the temperature inside the furnace is gradually lowered. In this way, a single crystal is grown from the melt of material. Then, the container support shaft 41 is lowered, and the parts 40L and 40R of the container 40 are separated from each other. Under this condition, cooling is done through the phase transition temperature range. Also in this case, a high-quality single crystal having a reduced twin defect density can be obtained.

Figure 9A:
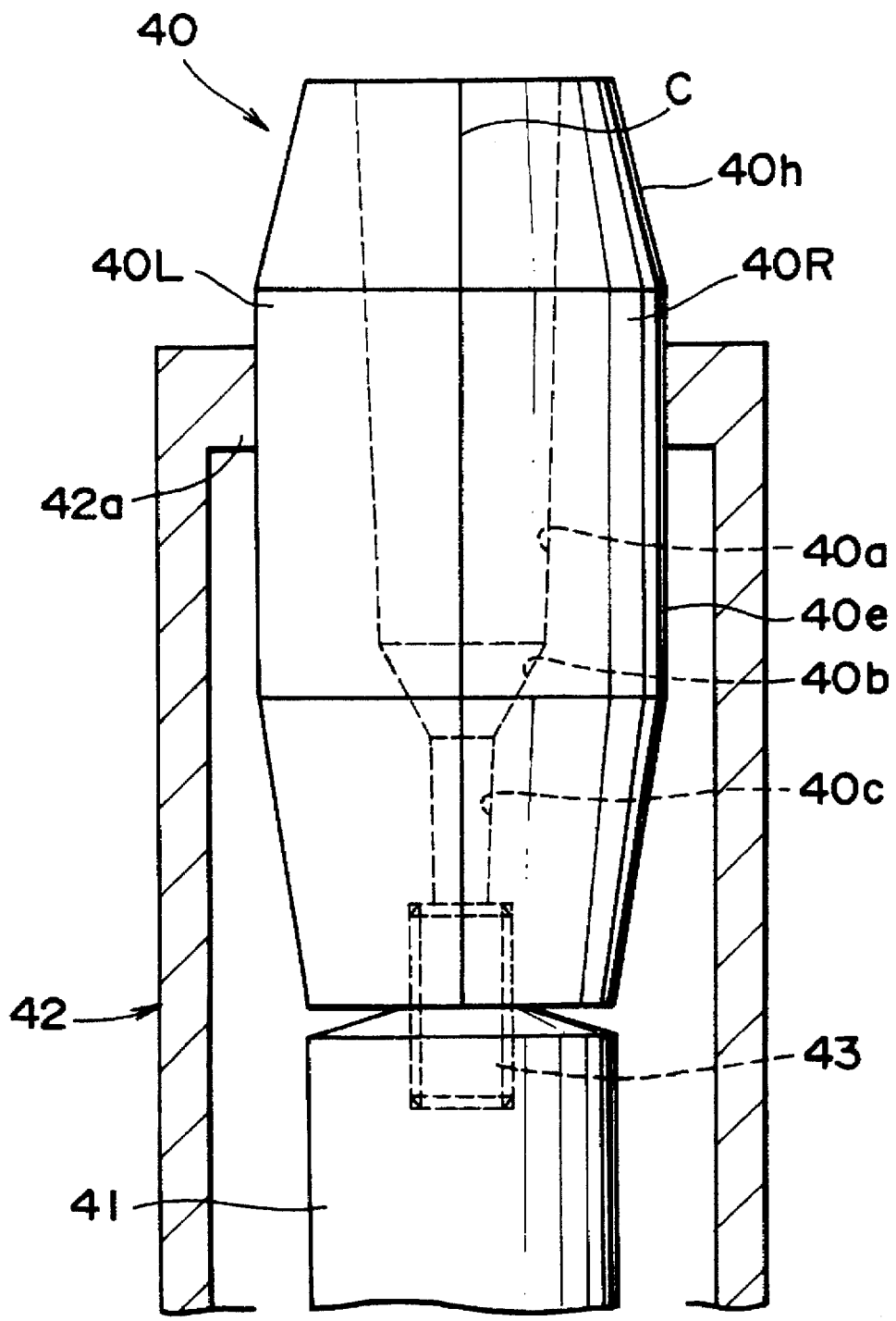
FIG. 9A is a front elevation of a main portion of a modification of the split-type raw material container shown in FIG. 5.
Figure 9B:
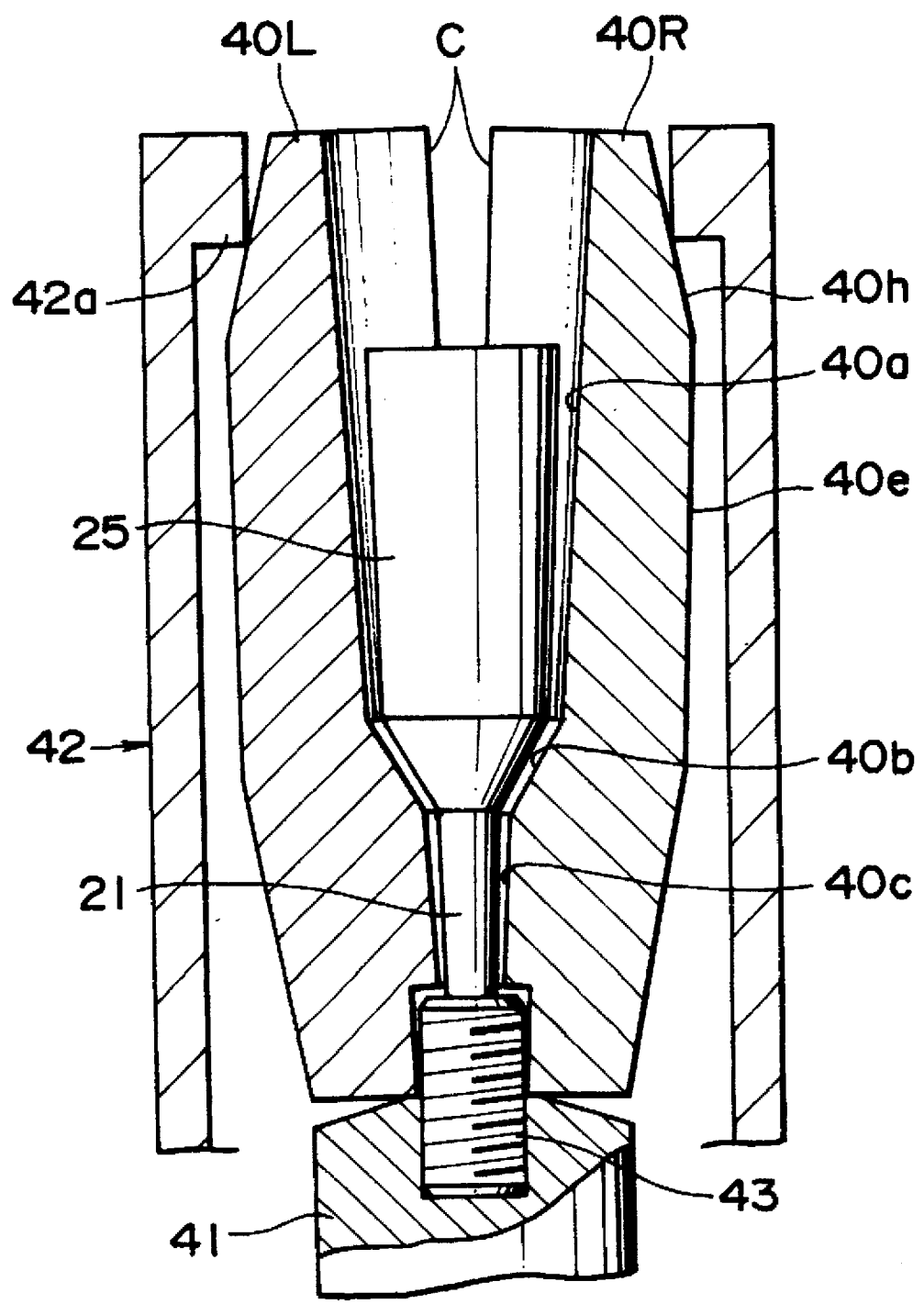
FIG. 9B is a cross-sectional view of the split-type raw material container shown in FIG. 9A, and in which the crystal is being cooled down after grown.

FIG. 9A shows a modification of the above-described raw material container 40. The modified container, also indicated by reference numeral 40, has an upper outer surface 40h tapering off upward instead of the reduced portion 40f described above. Because of this shape, when the container 40 is moved downward after growth of a crystal, the parts 40L and 40R of the container 40 are gradually thrown down, as shown in FIG. 9B. As a consequence, the grown crystal 25 is prevented from being damaged by the thrown parts 40L and 40R.

Figure 10A:
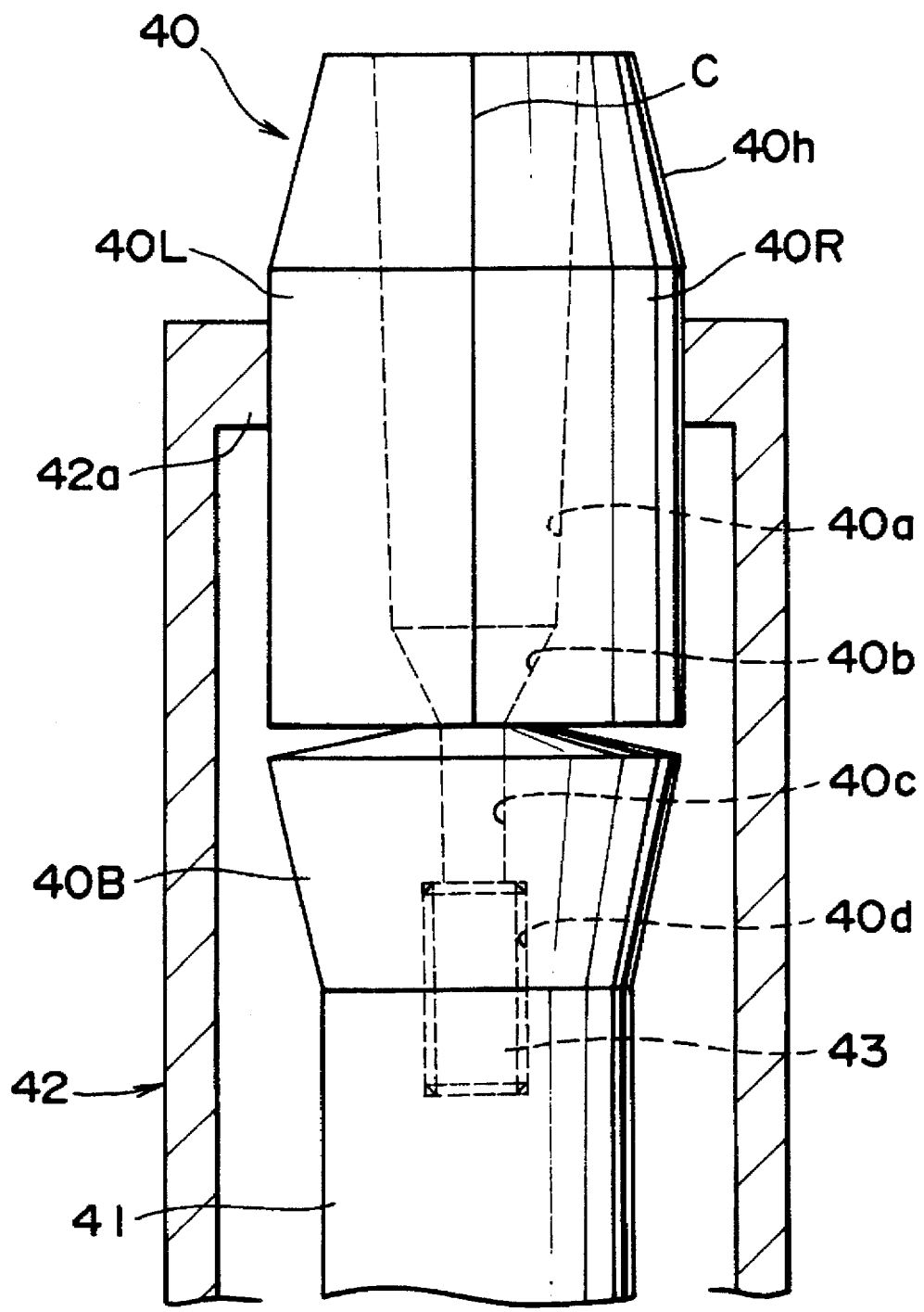
FIG. 10A is a front elevation of a main portion of a further modification of the split-type raw material container shown in FIG. 5.

FIG. 10A shows a further modification of the raw material container 40. The further modified container, also indicated by numeral 40, has a range where the material-accommodating portion 40a and the conical portion 40b are formed is constituted by parts 40L and 40R of the container 40 which are located on opposite sides, in the same way as the foregoing. A bottom portion where the thin tubular portion 40c and the tightening hole 40d are formed is separated from the parts 40L and 40R and forms a bottom container 40B.

Figure 10B:
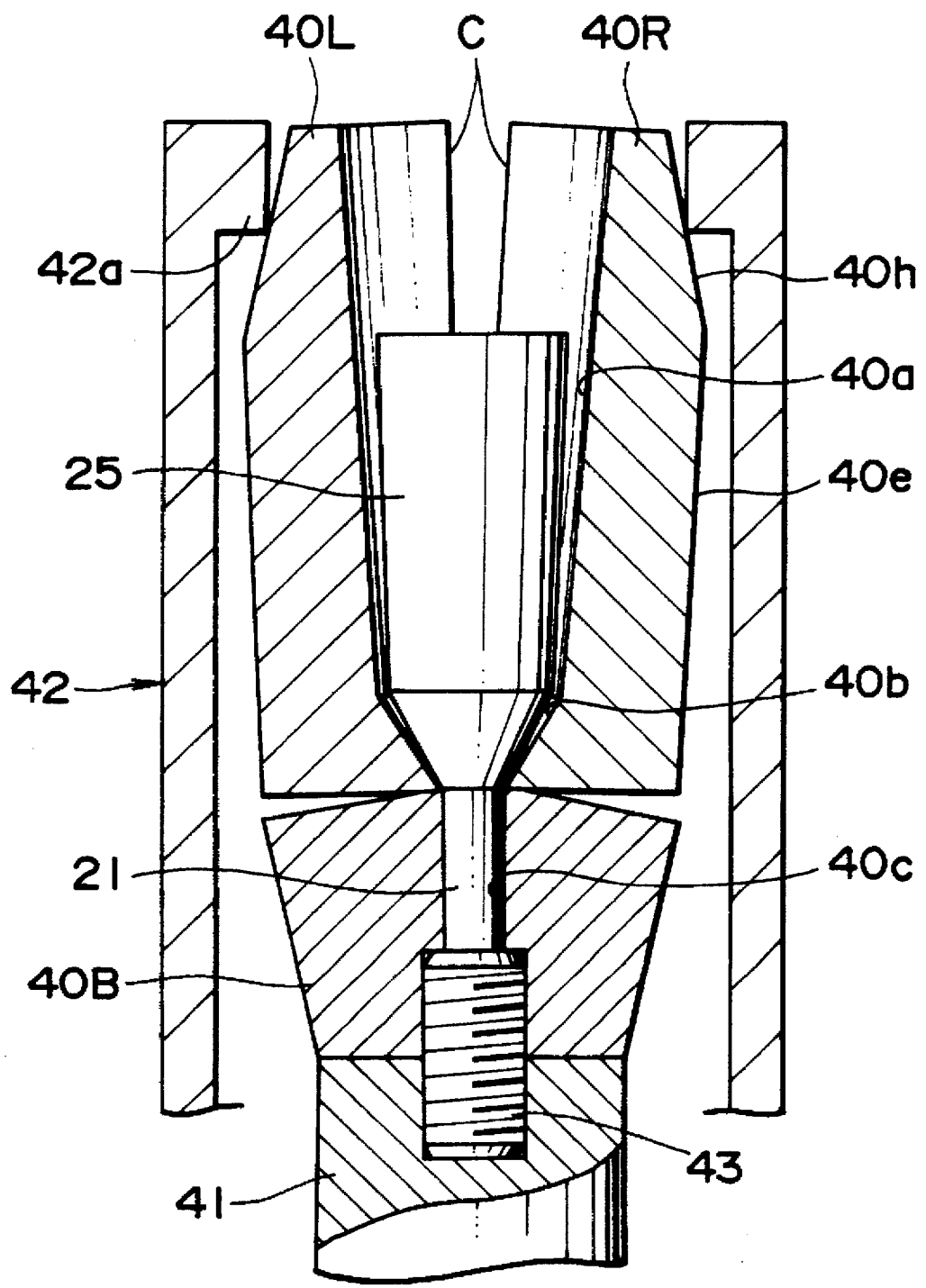
FIG. 10B is a cross-sectional view of the split-type raw material container shown in FIG. 10A, and in which the crystal is being cooled down after grown.

In this structure, as shown in FIG. 10B, after crystal growth, the raw material container 40 moves downward. At the same time, the parts 40L and 40R of the container are thrown down. At this time, the seed crystal 21 is held fitted in the thin tubular portion 40c inside the bottom container 40B. Therefore, this portion of the seed crystal 21 is kept in contact with the inner wall of the bottom container 40B.

Since the seed crystal 21 is held in this way, the overlying grown crystal 25 is prevented from being thrown together with the parts 40L and 40R of the container. It is assured that the grown crystal 25 is held upright.

In Example 4 described above, the portion surrounding the raw material container 40, especially the material-accommodating portion 40a, is horizontally divided into two. This makes the whole structure simpler. It is also possible to divide the surrounding portion into three, four, or more. Of course, it is considered that as the number of parts of the container is increased, more difficult machining operations are necessary. Also, the cost is increased. Furthermore, it is more difficult to machine the inner surface with accuracy adapted for crystal growth.

Also in the above example, the threaded fixture 43 is mounted to securely mount the raw material container 40 on the container support shaft 41. However, where the downward movement of the container 40 with the container support shaft 41 is assured by their own weights, the threaded fixture 43 can be dispensed with.

Furthermore, in the above example, as the container support shaft 41 moves downward, the parts 40L and 40R of the container 40 are thrown down by their own weights. This, in turn, shifts the parts 40L and 40R substantially horizontally outwardly. Other structure may also be adopted. For example, a dedicated mechanism for displacing the parts 40L and 40R horizontally outwardly may be incorporated in the machine.

EXAMPLE 5

In this example, a single crystal is fabricated by a CZ method. This is next described by referring to FIG. 11.

First, the structure of a machine used in the present example is described. This machine has a top cover 6 over which a rotating-and-pulling mechanism 31 is mounted. A rotating-and-pulling shaft 32 provided with a cooling water passage (not shown) depends from the rotating-and-pulling mechanism 31. The rotating-and-pulling shaft 32 extends into the top cover 6. The portion of the shaft 32 nested in the top cover 6 is held by a high-pressure seal member 33 so as to be capable of rotating and vertically moving. The rotating-and-pulling shaft 32 is long enough to extend through both heat-insulating member 2 and chamber 4. A seed crystal 21 is attached to the bottom of the rotating-and-pulling shaft 32.

A sealing liquid 34 is held on that portion of the outer surface of the rotating-and-pulling shaft 32 which faces the chamber 4. The elevation shaft 14 extending through the crucible support shaft 12 is not included in the present machine. The crucible 20 placed on the crucible support base 13 does not have the thin tubular portion 20c described in Example 1 and is shaped like a cup.

The process sequence for fabricating a single crystal, using the above-described high-pressure rotating-and-pulling machine is next described, along with results of the fabrication.

First, a charge of 6N-grade ZnSe polycrystals of 500 g was loaded into the crucible 20. The charge of material in the crucible 20 was heated to about 1530° C. in a high-pressure inert gas ambient by the heater elements 9 of the heater arrangement 3. At the same time, the Zn reservoir 17 was ramped up to 1000° C., thus creating a melt charge of ZnSe 24.

The seed crystal 21 was <111>-oriented cubic system, had a diameter of 2 mm, and was attached to the bottom of the rotating-and-pulling shaft 32. The seed crystal 21 was slowly lowered and then held at rest for 5 minutes immediately in front of the interface between the melt and the solid. Thereafter, the seed crystal 21 was lowered into contact with the melt 24 while rotating the crystal at 10 rmp. Then, in order to control the diameter of the crystal 25, it was grown at a rate of 1 mm/h while adjusting the temperature of the crucible 20 within the range of 1520°±3° C., in the same way as in a normal rotating-and-pulling method. At this time, the temperature gradient of the top of the liquid was 10° C./cm. After the growth, the crystal was maintained at a temperature higher than the temperatures in the above-described phase transition temperature range.

Then, the crystal 25 was separated from the melt 24 and the growth was ended. Subsequently, the crystal 25 was pulled at a speed of 5 mm/h while maintaining the temperature gradient at 10° C./cm. In this way, the crystal was cooled down through the phase transition temperature range.

The obtained ZnSe crystal had a bologna-shaped bowel, or body, having a diameter of 30 mm. The crystal was 55 mm long. The appearance of the crystal was considerably transparent pale yellow. The crystal was grown with orientation <111> in conformity with the orientation of the seed crystal. The outer surface of the crystal was etched with NaOH solution, and the appearance was observed. No twin planes were observed except in quite limited portions such as the shoulder portions of the crystal.

The ingot, or the bowel, was cut and polished at (100) plane. X-ray rocking curves emanating from the (100) plane of the wafer sample were measured. The full width at half maximum at (400) diffraction was 30 arc sec. This demonstrates that the crystal has good crystallinity.

The electrical characteristics of those portions of the crystal whose solidification ratios were 10%, 50%, and 90%, respectively, were evaluated. Their resistivities were as low as on the order of $10^{-1}$ Ω·cm. The variations in the resistivity among these portions were less than ±10%. In this way, the crystal had high uniformity.

When the seed crystal consisting of a cubic system <111> crystal is attached, the crystal should make a transition to the hexagonal system in the high-temperature phase. Because the (111) plane of the cubic system corresponds to the (0001) plane of the hexagonal system, and because atomic arrangement in the (111) plane is uniform, we consider that the crystallographic orientation of the seed crystal is reflected in the grown crystal.

COMPARATIVE EXAMPLE 2

Figure 11:
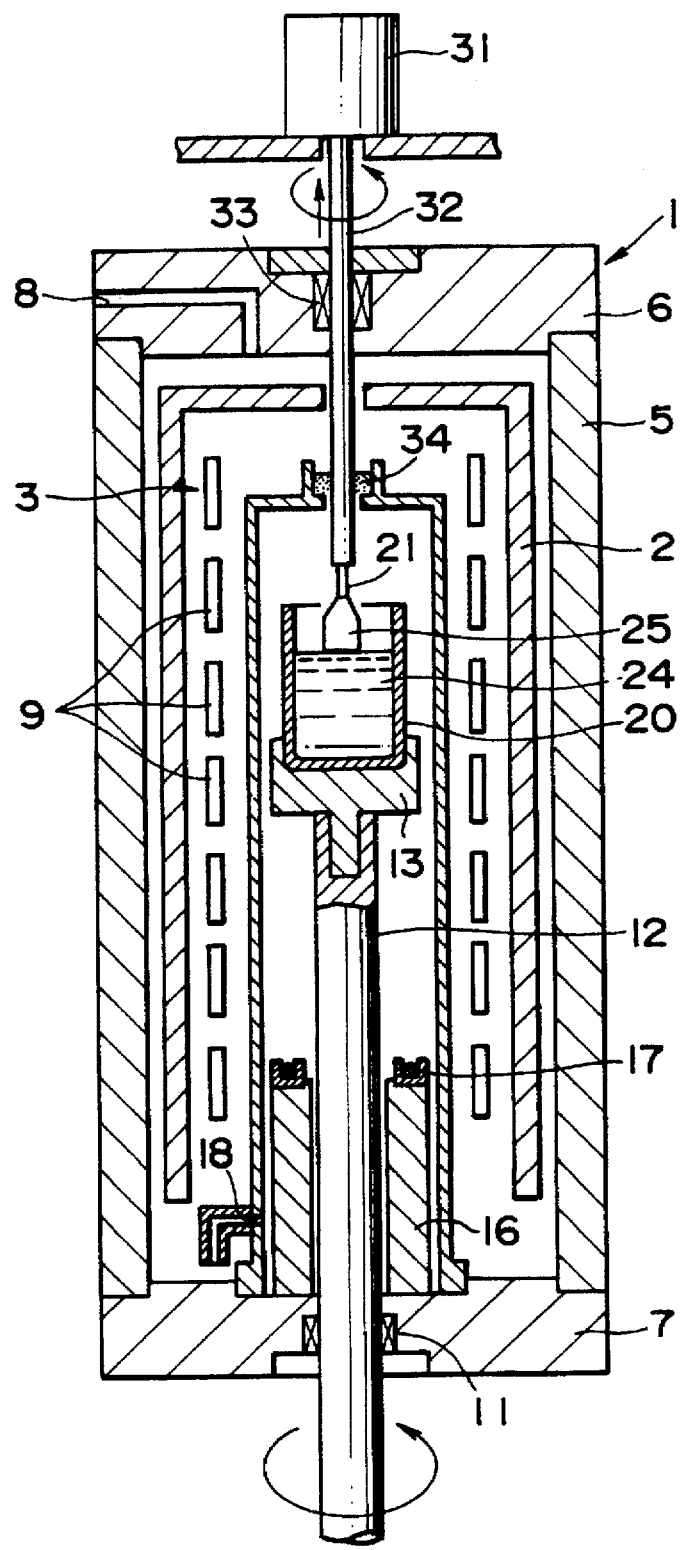
FIG. 11 is a schematic cross section of a further other single-crystal formation machine according to the invention.

Using the crystal grower shown in FIG. 11, a crystal was grown similarly to Example 5 except for the operation for lowering the temperature after crystal growth.

In this comparative example, a crystal was grown and separated from the melt. Then, the whole pulled crystal was placed in a uniform temperature portion. The whole grown crystal was placed at a substantially uniform temperature. The temperature was lowered from 1450° C. down to 1380° C. through the phase transition temperature range at a speed of 100° C./h. The obtained crystal was a lamellar single crystal of ZnSe having twins at a high density. This could not be used as a substrate for fabrication of a device.

What is claimed is:

1. A method of forming a single crystal, comprising the steps of:

growing a single crystal from a melt of which material loaded inside a container is melted;

thereafter bringing a grown crystal out of contact with a wall surface of said container; and lowering temperature of said grown crystal through a phase transition temperature range while establishing a temperature gradient from one end of said grown crystal to an opposite end.

2. A method of forming a single crystal as set forth in claim 1, wherein said material is ZnSe.

3. A method of forming a single crystal as set forth in claim 1, wherein said phase transition temperature range is 1409°±5° C.

4. A method of forming a single crystal as set forth in claim 1, wherein said step of bringing is carried out by pushing the grown crystal upward within said container at a temperature higher than temperatures in said phase transition temperature range.

5. A method of forming a single crystal as set forth in claim 1, wherein said step of growing is carried out within said container which tapers off and increases in diameter upward.

6. A method of forming a single crystal as set forth in claim 5, wherein said step of lowering is carried out by moving the grown crystal downward within said container.

7. A method of forming a single crystal as set forth in claim 5, wherein said step of lowering is carried out by controlling electric power supplied to heaters mounted in said container.

8. A method of forming a single crystal as set forth in claim 1,
wherein said step of growing is carried out after a substance which is in liquid phase and does not react with said grown crystal in said phase transition temperature range has been added to said charge of material loaded in said container, and
wherein said step of lowering is carried out while said substance not reacting with said crystal and in liquid phase is interposed between said wall surface of said container and said grown crystal.

9. A method of forming a single crystal as set forth in claim 8, wherein said material is ZnSe.

10. A method of forming a single crystal as set forth in claim 9, wherein said substance not reacting with said crystal is boron oxide.

11. A method of forming a single crystal as set forth in claim 8, wherein said step of lowering is carried out by moving the grown crystal downward within said container.

12. A method of forming a single crystal as set forth in claim 1,
wherein said step of growing is carried out within said container which can be divided into plural parts, and
wherein said step of bringing is carried out by moving said plural parts away from each other.

13. A method of forming a single crystal as set forth in claim 12, wherein said step of lowering is carried out by moving the grown crystal downward within said container.

14. A method of forming a single crystal as set forth in claim 12, wherein said step of lowering is carried out by controlling electric power supplied to heaters mounted in said container.

15. A method of forming a single crystal as set forth in claim 12, wherein said container comprises a material-accommodating portion tapering off downward and having a hole extending from its upper end, an inverted truncated conical portion disposed under the material-accommodating portion, and a thin tubular portion disposed under said conical portion.

16. A method of forming a single crystal as set forth in claim 1, wherein said step of growing is carried out by pulling the grown crystal upward while rotating it after a seed crystal has been brought into contact with said melt of material, and wherein said step of lowering is carried out by pulling said grown crystal upward after the grown crystal is cut off said melt of material.

* * * * *